United States Patent [19]
Arbach et al.

[11] Patent Number: 5,021,129
[45] Date of Patent: Jun. 4, 1991

[54] MULTILAYER STRUCTURES OF DIFFERENT ELECTROACTIVE MATERIALS AND METHODS OF FABRICATION THEREOF

[75] Inventors: Gary V. Arbach, Mahopac; Terrence R. O'Toole, Hopewell Junction; Alfred Viehbeck, Stormville, all of N.Y.

[73] Assignee: International Business Machines Corporation, Armonk, N.Y.

[21] Appl. No.: 411,952

[22] Filed: Sep. 25, 1989

[51] Int. Cl.$^5$ .............................................. C25D 5/02
[52] U.S. Cl. ...................................... 204/15; 204/20; 204/30
[58] Field of Search ........................... 204/15, 20, 30; 427/304, 305, 443.1

[56] References Cited

U.S. PATENT DOCUMENTS

| | | | |
|---|---|---|---|
| 3,505,168 | 4/1970 | Dunphy et al. | 428/473.5 |
| 4,261,800 | 4/1981 | Beckenbaugh et al. | 204/15 |
| 4,322,457 | 3/1982 | Baron et al. | 427/259 |
| 4,347,286 | 8/1982 | Ishizuka et al. | 428/349 |
| 4,710,403 | 12/1987 | Krause et al. | 427/304 |
| 4,788,098 | 11/1988 | Sado et al. | 428/215 |

FOREIGN PATENT DOCUMENTS 62-066932  3/1987  Japan .

Primary Examiner—T. M. Tufariello
Attorney, Agent, or Firm—Daniel P. Morris

[57] ABSTRACT

Structures and methods of fabrication thereof wherein the method selectively supplies electrons to a first electroactive material in the presence of a second electroactive material wherein the first and second electroactive materials have different redox potentials. The electrons are selectively supplied either by electrochemical means or by appropriately chosen reducing agents. A structure fabricated by these methods has a first electroactive body disposed on a second electroactive body wherein the first body has a pattern therein exposing at the base thereof the surface of the second electroactive material body. Electrons can be selectively supplied to the surface of the second electroactive material body which is exposed at the base of the pattern in the first electroactive material body. Upon exposing the structure to a seeding solution seed is selectively supplied to those regions to which electrons have been selectively supplied. Electrically conductive material can then be electrolessly deposited onto the seed material to form an electrically conductive pattern in the pattern in the first electroactive body. The electroactive material bodies are preferably polyimide materials. The structures can be used as the top metallization levels of an electronic device such as a semiconductor chip or a semiconductor chip packaging substrate.

37 Claims, 2 Drawing Sheets

MULTILAYER STRUCTURES OF DIFFERENT ELECTROACTIVE MATERIALS AND METHODS OF FABRICATION THEREOF

CROSS REFERENCE TO A RELATED APPLICATION

Copending U.S. patent application Ser. No. 7/290,486 filed Dec. 23, 1988 entitled "Method For Conditioning An Organic Polymeric Material" of Viehbeck et al., and assigned to the same assignee as the present invention describes, certain organic polymeric materials are capable of reversibly accepting or donating electrons from a reducing entity. The redox sites in the polymer accept electrons and, as a result, a change in the oxidation state of the polymer occurs. This change is useful in modifying or etching the polymeric material. The material can be modified by incorporation of metallic seeds into the material at a controlled depth. The seeds are incorporated by interaction of cations of the metals with the redox sites in the polymer, which cause the reduction of the cations to form neutral metallic seeds. Subsequent exposure of the polymeric material containing the seeds to an electroless bath causes further deposition of metal having the desirable characteristic of good adhesion to the polymeric material. Etching of the polymeric material can be carried out as a result of an increase in solubility of the polymer in aprotic solvents when its redox sites have accepted electrons. The increased solubility allows openings to be etched in certain areas of the polymeric material that have been reduced, leaving other areas unchanged.

FIELD OF THE INVENTION

The present invention is concerned with multilayer structures containing layers of different electroactive materials and the methods of fabrication thereof. In particular, the present invention is directed to multilayer structures useful for electronic devices and electronic device packaging structures. Most particularly, the present invention is directed to a structure having a first and second polyimide layer each having a different redox potential, one layer of which has a pattern therein in which seed is deposited and conducting material is electrolessly deposited on the seed layer.

BACKGROUND OF THE INVENTION

In the manufacture of printed circuit cards and boards, a dielectric sheet material is employed as a substrate. Conductive patterns are provided on one or both the major surfaces of the substrate. In some applications more than one level of conducting circuit patterns are required on one or both sides of the substrate. Plating is the most commonly used method of metalizing these substrates. Generally, in order to plate on the substrate it must be seeded or catalyzed prior to the deposition of metal thereon. Included among the various dielectric materials suggested for substrates are various organic polymers including polyimides, polyesters, polysulfones and the like. Moreover, multilayer dielectric structures, including multilayer polyimide structures, are used as the top wiring levels of integrated circuit chips and VLSI packaging. Plating techniques can be used to fabricate these wiring levels.

Among the more widely employed procedures for catalyzing a substrate is the use of a stannous chloride sensitizing solution and a palladium chloride activator to form a layer of metallic palladium particles thereon.

For instance, one method of catalyzing a dielectric substrate is exemplified by U.S. Pat. No. 3,011,920 which includes sensitizing a substrate by first sensitizing it with a solution of a colloid metal, activating the colloid with a selective reagent to remove unreactive regions on the sensitized dielectric substrate, and then electrolessly depositing a metal coating on the sensitized substrate, for example, copper can be deposited from a solution of a copper salt and a reducing agent.

To fabricate a multilayer structure having a plurality of conducting layers using a stannous chloride sensitizing solution in a palladium chloride activator solution requires many steps. For example, on a first dielectric layer there is deposited a second dielectric layer; a pattern is formed in the second dielectric layer; and a seed material is deposited only onto the exposed region of the first dielectric layer. In order to achieve this selective seeding, the surface of the second dielectric layer must be protected to prevent the seeding thereon. This can be achieved, for example, by disposing on the second dielectric layer a patterned photoresist material. The requirement to use this photoresist material adds complexity and cost to the fabrication process and is also a potential source of undesired contamination.

According to one aspect of the present invention a first dielectric layer of an electroactive material is provided. A second dielectric layer of a different electroactive material is disposed over the first dielectric layer. The first and second electroactive material have differing redox potentials. Electrons are provided at an energy sufficient to reduce only one of the electroactive materials. The structure is then placed into contact with a seeding solution that contains cations of a metal. Electrons are transferred from a reduced electroactive material to the cations which deposit onto the reduced electroactive material as seed in the zero oxidation state. Next, a metal can be deposited from an electroless or electroplating bath onto the seed metal.

It is an object of this invention to selectively reduce a first electroactive material in the presence of a second electroactive material wherein the first electroactive material has a redox potential positive of the redox potential of the second electroactive material.

It is another object of this invention to provide a multilayer structure having layers of material of different redox potentials.

Another object of this invention is to provide structures having layers of electroactive material with different redox potentials containing electrically conducting patterns embedded therein.

Electrons are supplied to the redox sites of the electroactive material by either means of a cathode in an electrochemical circuit or from a reducing agent in solution. The electrons supplied by the electrode or reducing agent have a potential negative of the potential of the electroactive material on which the electrons are being deposited but more positive of the reduction potential of the electroactive material on which the electrons are not deposited.

U.S. Pat. No. 3,505,168 to Dunphy et al. describes a heat sealable laminate structure having at least two layers of polyimide polymeric material wherein the polyimide of one of the layers is different from the polyimide of the other layers. There is no teaching or suggestion therein to dispose a pattern in either one of the polyimide layers nor to form an electrical conductor in the pattern in the polyimide layer.

U.S. Pat. No. 4,788,098 to Sado et al. describes an aromatic polyimide laminate sheet wherein a second film layer is preferably the same as the first film layer but can be different. There is no teaching or suggestion to form a pattern in one of the polyimide layers nor to form a conducting pattern within a pattern in the polyimide layer.

U.S. Pat. No. 4,347,286 describes compound films of a polyimide film and a heat fusible layer of a polyimide precursor. There is no teaching or suggestion to form patterns in one of the films nor to form a conducting pattern within a pattern in a dielectric film.

U.S. Pat. No. 4,710,403 to Krause et al. describes a method of metallizing an electroactive center-containing polymeric substrate by first supplying electrons to the electroactive center by contacting the substrate with a solution containing ions, such as intercalation ions, e.g., $Te^{2-}$, V(II) and Co(I) complexes in aqueous or methanolic reductants. The reduced polymer is then contacted with a solution of metal salts to result in deposition of the metal. There is no teaching or suggestion in Krause et al. to selectively reduce one electroactive center-containing polymeric material in the presence of a second electroactive center-containing polymeric material.

SUMMARY OF THE INVENTION

One aspect of the present invention is a structure having a first electroactive material body disposed in contact with a second electroactive material body wherein the redox potential of the first and second electroactive material bodies are different and wherein one of the electroactive material bodies has a pattern formed therein exposing in the pattern the other electroactive material body.

In a more particular aspect of the structure of the present invention, the pattern is formed in the body having the more negative redox potential exposing the other body and a conducting material is disposed in the pattern.

Another aspect of the present invention is a method for selectively reducing a first electroactive material body in the presence of a second electroactive material body wherein the first electroactive material body has a redox potential more positive than the redox potential of the second body.

In a more particular aspect of the present invention, the electroactive material bodies are polymeric materials.

In another more particular aspect of the present invention the polymeric materials have either similar or different class of chemical functional groups.

In another more particular aspect of the present invention, the electroactive material bodies are polyimide bodies.

In another more particular aspect of the methods of the present invention, a seed material is disposed in the pattern of the patterned electroactive material body.

In another more particular aspect of the present invention, electrons are supplied to the reduced electroactive material body by selectively supplying electrons to redox sites (i.e., sites which can undergo reduction and oxidation) on the non-patterned electroactive material at the base of the pattern in the patterned electroactive material body. There is concurrent uptake of counter cations by the reduced electroactive material from an electrolyte to balance the negative charge on the reduced electroactive material. The reduced electroactive material is then placed into contact with the solution that contains cations of a metal which will diffuse into the electroactive material and contact the redox sites thereof resulting in reduction of the metal cation to the zero oxidation state and being deposited at the base of the pattern.

Metal deposited in such a manner can mediate continued electron transfer from the polymer resulting in further metal deposition near the previously deposited metal. The redox sites thereby transfer electrons to the cation that is energetically disposed to receiving electrons from the redox sites to thereby reduce the cations to metal atoms in the zero oxidation state. The supplied electrons have a potential which is negative of the patterned electroactive material body and positive of the other electroactive material body resulting in electrons being transferred to the non-patterned electroactive-material body.

In another more particular aspect to the method of the present invention, a second metal is deposited from an electroless plating bath onto the zero oxidation state metal.

In another more particular aspect to the method of the present invention, a third metal can be deposited onto the second metal by electrolytic plating.

The electrons are supplied to the redox sites of the electroactive material by either means of a cathode in an electrochemical circuit, the potential applied to the cathode being equal to or negative of the reduction potential of the electroactive material on which zero oxidation state metal is to be deposited and positive of the reduction potential of the electroactive material on which zero oxidation state metal is not to be deposited. Electrons can also be supplied by a reducing agent in solution, the oxidation potential of the reducing agent being negative with respect to the reduction potential of the electroactive material on which the zero oxidation state metal is deposited and positive of the reduction potential of the electroactive material body on which zero oxidation state metal is not to be deposited.

These and other objects, features and advantages will be apparent from the following more particular description of the preferred embodiments and the figures appended thereto.

DETAILED DESCRIPTION OF THE PREFERRED EMBODIMENT

Figure 1:
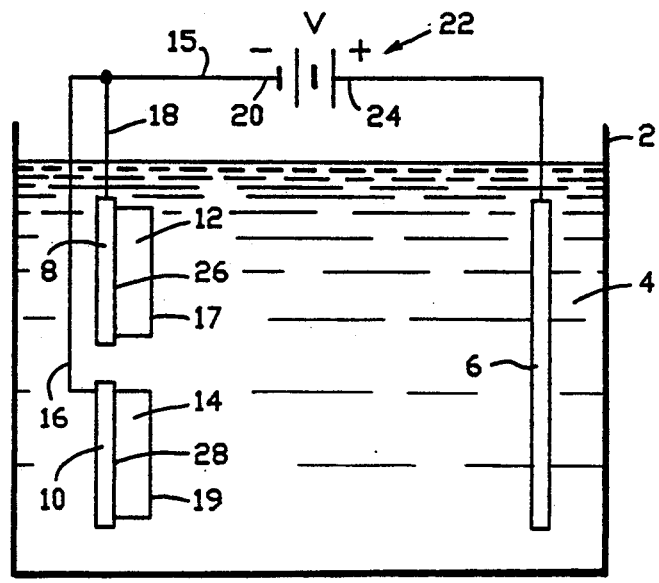
FIG. 1 diagrammatically shows the electrochemical selective deposition of electrons on a first electroactive body in the presence of a second electroactive body.

FIG. 1 diagrammatically shows an electrochemical method according to the present invention. In a container 2 there is an electrolyte 4. Immersed in the electrolyte is an anode 6, a first cathode 8 and a second cathode 10. On the first cathode 8 is disposed electroactive body 12 and on the second cathode 10 is disposed electroactive body 14. Wire 16 is electrically connected to cathode 10 and wire 18 is electrically connected to cathode 8. Wires 16 and 18 are electrically connected to the negative terminal 20 of a voltage source 22 and the anode 6 is electrically connected to the positive terminal 24 of power source 22.

Figure 2:
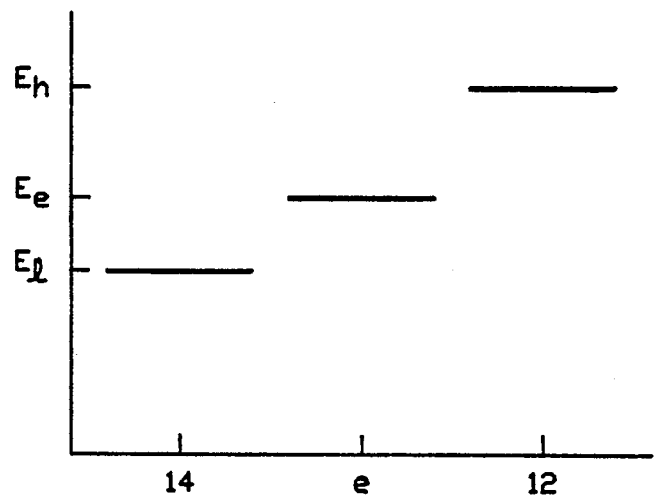
FIG. 2 is a plot showing relationship $E_h > E_e > E_i >$ diagrammatically.

Anode 6 can be made from any material commonly used in the art, for example, stainless steel, platinum, carbon, palladium, gold and nickel. The cathodes 8 and 10 can be fabricated from any material commonly used in the art as an anode, for example, stainless steel, glassy carbon, platinum, gold, conductive $SnO_2$ glass. The electrolyte 4 can be any electrolyte commonly used in the art, for example, aqueous or non aqueous solvents containing dissolved salts. The electrolyte 4 is capable of sustaining a current between anode 6 and cathodes 8 and 10 when voltage V is applied by voltage source 22 between the anode and cathodes, wherein the anode is positive with respect to the cathodes. Electrons flow from the anode 6 to the cathodes 8 and 10 and are transferred from cathode surfaces 26 and 28 to one of bodies 12 and 14 respectively. The electrons travel through the bodies 12 and 14 to surfaces 17 and 19 thereof respectively. Oxidation reactions at anode 6 can generate cations which diffuse to surfaces 17 and 19 where electrons can be picked up. At the surfaces 26 and 28 of the electroactive bodies 12 and 14 respectively the electrons have an energy $E_e$. Each electroactive body contains electroactive sites characterized by an oxidation/reduction potential energy. One of the electroactive bodies, for example, 12 has a redox potential energy $E_h$ and the other electroactive body, for example, 14, has electroactive sites characterized by a redox potential energy $E_l$. The voltage V of the voltage source 22 is chosen such that the following condition is satisfied $E_h \geq E_e \geq E_l$. A preferred method to control the potential energy is to operate under potentiostatic static conditions which uses a third (non-polarizable) electrode as a reference source, as described in "Electrochemical Methods, Fundamentals and Applications", A. J. Bard and L. R. Faulkner, John Wiley & Son, 1980, pp. 22–35 and in "Electro-Chemical Science", J. Bockris and D. Drazic, Barnes & Noble Books, N.Y., 1972, pp. 31–34, the teachings of which are incorporated herein by reference. FIG. 2 is a plot which diagrammatically represents this situation. On a horizontal axis of FIG. 2 is represented the electroactive bodies 12 and 14 and the electron "e" and on the vertical axis is plotted the energy. Since the electron "e" has an energy which is less than $E_h$ the electron cannot be transferred to the electroactive body 12; however, since the electrons energy $E_e$ is greater than the energy $E_l$ of the electroactive sites on body 14 the electrons can be transferred to body 14. Therefore, by this method electrons can be selectively supplied to a first electroactive body in presence of a second electroactive body wherein the redox potential energy of the electroactive sites on the first electroactive body is less than the redox potential energy of the electroactive sites on the second electroactive body.

Figure 3:
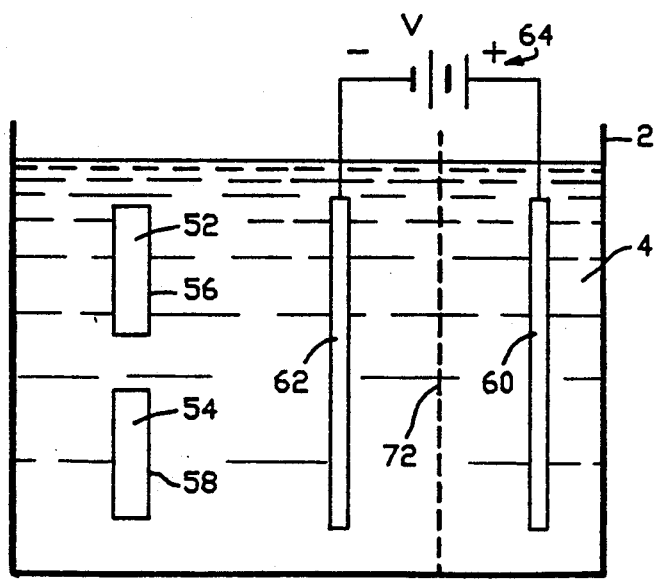
FIG. 3 shows the electroless selective supplying of electrons to a first electroactive body in a presence of a second electroactive body.

FIG. 3 diagrammatically represents selectively supplying electrons to a first electroactive body 52 in the presence of a second electroactive body 54 wherein an electrical potential is not provided between an anode and a first and second cathode on which the electroactive bodies 12 and 14 are disposed as shown in FIG. 1. A reducing agent can be added to the electrolyte solution 4. If the reducing agent contains valence electrons which are available for transfer in an oxidation/reduction reaction and are at an energy $E_e$ as shown in FIG. 2, the electron can be transferred to an electroactive site in electroactive body 54 which has a redox potential energy $E_l$ which is less than the energy of the electrons in the reducing agent and the electrons in the reducing agent cannot be transferred to the electroactive sites in electroactive body 52 which has a redox potential energy $E_h$ which is higher than the energy of the electron reducing agent. An alternative way of introducing a reducing agent into the electrolyte solution 4 is by adding to solution 4 a reagent which can be reduced by an electrochemical current between cathode 62 and anode 60 which are connected to voltage source 64. This latter mode requires that anode and cathode solutions are separated by an appropriate membrane 72 to inhibit transport of reducing agent into the anode compartment and oxidized species from anode to cathode compartment. The membrane can be those commonly used in the art such as a porous sintered glass disk, or ion selective polymer or appropriate salt bridge.

Details of the electrochemistry of the methods shown in FIGS. 1 and 3 will be provided herein below.

Figure 4:
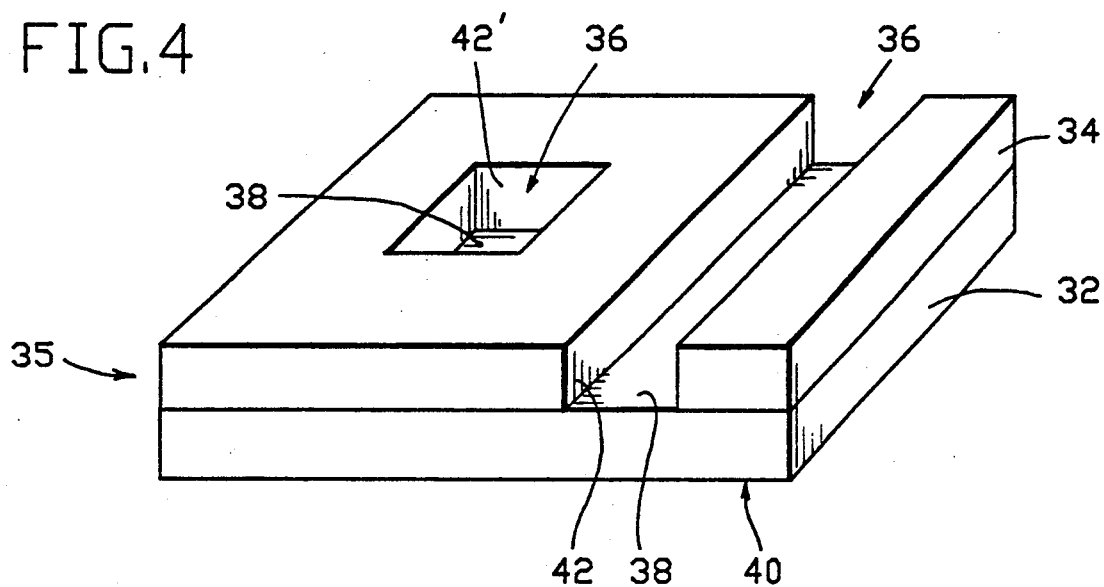
FIG. 4 diagrammatically shows a structure having a patterned electroactive body disposed on a second electroactive body wherein regions of the second electroactive body are exposed.

FIG. 4 shows a structure which can be used in the methods of the present invention. The structure has a first layer of electroactive material 32. Disposed thereon is a second layer of electroactive material 34 which has a pattern 36 formed therein exposing surface 38 of electroactive layer 32. The pattern can be formed, for example, using commonly known photolithography methods, reactive ion etch methods, laser ablation, chemical etching and direct patterning of the electroactive material if it is photosensitive.

Surface 40 of electroactive layer 32 of structure 35 of FIG. 4 which is not disposed against the patterned electroactive layer 34 can be disposed on an electrically conductive material suitable for forming a cathode for an electrochemical circuit as shown in FIG. 1. As described with reference to FIG. 2 if an appropriate voltage is chosen for voltage source 22 electrons can be selectively transferred to layer 32 to layer 34 through layer 32 if layer 34 is reduced or to layer 32 and 34 if both are in contact with the cathode. If the redox potential energy of the electroactive sites of electroactive material 34 is less than the redox potential energy of the electroactive sites of electroactive material 32 electrons will be supplied to the surface of layer 34 including onto the sidewalls 42. If the redox potential energy of the electroactive sites in layer 32 is lower than the redox potential energy of the electroactive sites in layer 34, the electrons will be supplied to the surface of layer 32 including onto the surface 38 of electroactive layer 32 which is exposed in the pattern 36 in electroactive layer 34. Therefore, electrons can be supplied to the bottom surface of the pattern 36 in layer 34.

Alternatively, the structure 34 of FIG. 4 can be immersed in the solution 4 of the apparatus diagrammatically shown in FIG. 3 without disposing the structure 35 onto a material suitable to function as a cathode. As described with reference to FIGS. 2 and 3 a chemical reducing agent is either added to the solution 4 or generated in solution and is capable of transferring electrons selectively to the surfaces of layer 32 or 34.

To the solution 4 of FIG. 1 cations can be added or solution 4 of FIG. 3 can be replaced with a solution containing cations after appropriate reduction of 35, preferably metal cations, which have energy levels suitable for the electrons which have been selectively supplied to parts of the structure 35 of FIG. 4 to transfer to the cations resulting in atoms in the zero oxidation state being deposited onto the surface to which the electrons have been supplied. If the zero oxidation state material which is deposited is a metal such as palladium it can be used as a seed material for subsequent electroless deposition of metal thereon. Alternatively, structure 35 of FIG. 4 which is selectively chemically reduced as described with reference to FIG. 3 is removed from the reducing solution and immersed in a seeding solution to deposit seed on the selectively reduced regions.

For the electroless surface reducing agent in solution, the amount of seed metal deposited by the redox-mediated process is dependent of the amount on the electroactive body which is in the reduced form.

The electroless deposition of metal onto seed layers is commonly known in the art. Examples of materials suitable for seed materials are palladium, nickel, silver, gold, platinum ruthenium and copper. These materials can be singly deposited or codeposited. Palladium is particularly effective as a seed material. Materials commonly used in the art for electroless deposition are metals such as copper, cobalt, palladium, nickel, silver, gold and alloys thereof. These materials can be singly deposited or codeposited. Copper is particularly useful and is readily electrolessly deposited. Thickness as great as 35 microns or more can be electrolessly deposited.

If the seed is sufficiently continuous to carry a current, metal can be electroplated onto the seed by methods commonly known in the art. If the seed layer is not sufficiently thick to carry a current for electroplating an electroless metal layer can be deposited thick enough to carry a current and metal can be electroplated thereon by methods commonly known in the art. Examples of metals which can be electroplated are Au, Ag, Cu, Co, Ni, Pd, Pt, Sn and alloys thereof.

Figure 5:
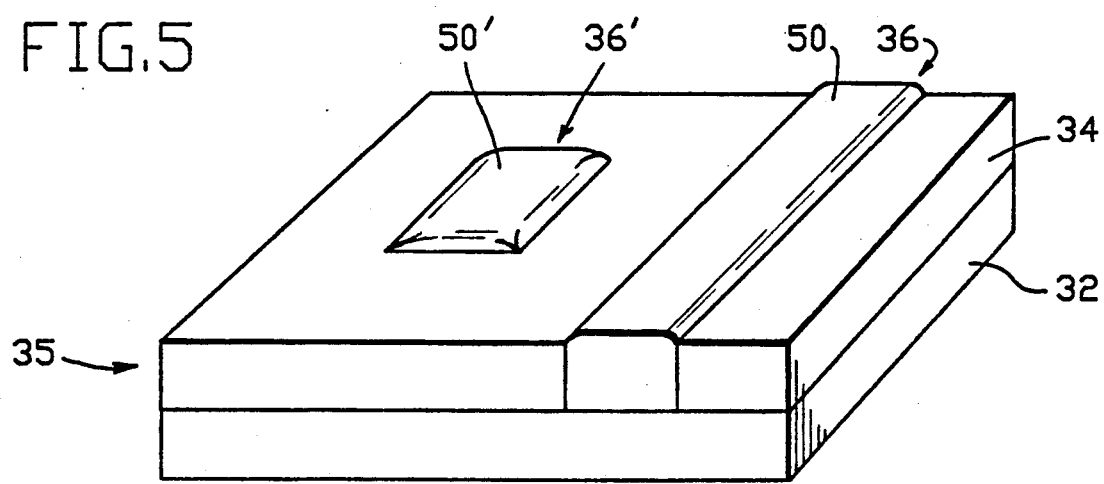

In the preferred embodiment a seed layer is deposited onto exposed surface 38 of electroactive material 32 in the base of patterns 36 in layer 34 to result in a structure shown in FIG. 5 having electrolessly plated or electroplated conductors 50 in patterns 36 of layer 34 of structure 35.

In the preferred embodiment the electroactive materials are polymeric materials, most preferably polyimide materials. However, any material having electroactive sites can be used to practice the present invention. Examples of materials are combinations of organic and inorganic materials, such as Prussian blue (ferriferro cyanide) and organometallic materials, such as ruthenium bipyridien containing polymers.

The structure shown in FIG. 5 can be used as the top metallization levels of an electronic device such as a silicon chip or as the top level metallization levels of an electronic device packaging substrate such as a ceramic or polymer substrate. The structure shown in FIG. 5 is not limited to two levels it can be a multi-level structure having any number of layers of electroactive material and electrically conducting patterns. The plated structure 35 can be planarized by any polishing or milling technique, prior to application of subsequent layers, such as commonly known micromilling techniques and chemical mechanical polishing with a slurry. Adjacent layers of electrically conductive patterns can be interconnected by conductive via studs. The vias or studs can be fabricated by disposing a dielectric layer, preferably an electroactive dielectric layer, on an electroactive dielectric layer having a metal pattern formed therein as described above. A pattern of through holes is formed in the dielectric layer over the exposing part of the conductive pattern at the base of the through-hole. The exposed conductor can be selected and electrolessly plated or electrolytically plated. Seed may not be necessary if the conductor is susceptible to electroless plating without a seed.

In the preferred embodiment it has been found that in order to obtain the greatest degree of selectivity in depositing the seed material between two electroactive layers the difference in the energy levels $E_h$ and $E_l$ is preferably greater than about 20 millivolts most preferably greater than about 100 mV. This condition is not required but is preferred because it has been found that rate of transfer of electrons either electrochemically or from a reducing agent is more effective if the different between the electron energy $E_e$ and energy $E_l$ is preferably greater than about 50 mV, most preferably greater than about 10 mV. For an energy difference less than about 10 mV the rate of electron transfer is slow and may not be suitable for a high scale manufacturing environment for microelectronic components.

Electroactive sites of an electroactive material such as polyimides can be reduced by more than one electron as will be described in detail hereinbelow. The energy of these electroactive sites are typically recorded as the redox potential (the redox potential energy $E_o$ is equal to the negative of the magnitude electronic charge times the redox potential). $E_o$ is the Fermi energy of the redox couple when a 1:1 ratio exists between the oxidized and reduced states for the couple. The potential for supplying one electron to the electroactive site is designated as $^1E^0$, the redox potential for supplying a second electron to the electroactive site is designated as $^2E^0$ and the redox potential for supplying n electrons to the electroactive site is designated as $^2E^O$ and the redox potential for supplying n electrons to the electroactive site is designated $^nE^0$.

Tables 1 and II lists the redox potentials for a selected number of polyimide materials which can be used to practice the present invention. Materials listed in Table 1 and Table II are exemplary only and not limiting.

Toroy 3480 having BTDA-ODA functionally and Hitachi P2-1075 having BPDA-ODA functionality, Asahi 6246 ® having a PMDA-ODA and BTDA-ODA copolymer functionally, Toray 414 ® having a BPDA-ODA functionality and Ciba-Geigy 412 ® having a BTDA-TMDA functionality are also useful photosensitive polyimides.

TABLE I

| REDOX POTENTIALS FOR POLYIMIDE FILMS | | | |
|---|---|---|---|
| POLYIMIDE | $1_E0$ | $2_E0$ | $3_E0$ |
| BPDA-PDA (PI-5811 ®[6,7]) | −1.37 | −1.58 | — |
| HFDA-ODA (PI-2566 ®[8]) | −1.35 | −1.49 | — |
| BTDA-DAPI[1] (XU-218 ®) | −1.04 | −1.24 | −1.74 |
| BTDA-APB[3] (THERMID 630 ®) | −1.01 | −1.29 | −1.80 |
| PMDA-ODA[4] (PI-2545 ®[9]) KAPTON ®) | −0.79 | −1.33 | — |
| PMDA (ETHYLESTER) ODA | −0.78 | −1.45 | — |
| PMDA-HDA | −0.78 | −1.60 | — |
| PMDA-MCA | −0.80 | −1.44 | — |
| NTDA-ODA[2] | −0.64 | −1.03 | — |

TABLE I-continued
REDOX POTENTIALS FOR POLYIMIDE FILMS

| POLYIMIDE | $1_E0$ | $2_E0$ | $3_E0$ |
|---|---|---|---|
| BPDA-PDA[5] (UPILEX ®) | −1.34 | | |

CV's run in 0.1 M TBAFB/ACN, 50 mV/sec.
DAPI = diamino-1,3,3-trimethyl-1-phenylindan
APB = 1,3-bis-(2-aminophenoxy)benzene
HDA = hexamethylenediamine
HFDA = hexafluoroisopropylidene phthalic dianhydride
$E^0$ is referenced versus the saturated calomel electrode (SCE) and determined by cyclic voltammentry in 0.1 M tetrabutylammonium tetrafluoroborate in acetonitrile.
[1]BTDA-DAPI is 3,3',4,4'-benzophenone tetracarboxylic dianhydride-diamino-1,2,2-trimethyl-1-phenylindan which is commerically available from Ciba-Geigy under the tradename XU-218 ®.
[2]NTDA-ODA is 1,4,5,8-naphthalene tetracarboxylic dianhydride-4,4'-oxydianiline.
[3]BTDA-APB is 3,3',4,4'-benzophenone tetracarboxylic dianhydride-1,3-bis-(2-aminophenoxy) benzene is commercially available from National Starch and Chemical Company under the tradename Thermid ®.
[4]Kapton ® is a trademark of DuPont.
[5]Upilex ® is a trademark of Ube.
[6]BPDA is 3,3',4,4'-biphenyltetracarboxylic dianhydride
[7,8,9]Requested trademark of DuPont

TABLE II
REDOX POTENTIALS FOR POLYIMIDE FILMS

| PSPI | FUNCTIONALITY | $1_E0$ | $2_E0$ | $3_E0$ |
|---|---|---|---|---|
| CIBA-GEIGY, 412 ® | BTDA-TMDA | −0.88 | −1.22 | −1.85 |
| ASAHI G6246A ® | PMDA-ODA | −0.76 | −1.37 | — |
| | BTDA-ODA | −0.92 | −1.22 | −1.78 |
| TORAY 3840 ® | BTDA-ODA | −1.02 | −1.20 | −1.67 |

CV's run in 0.1 TBAFB/DMF, 50 mV/sec.
Potentials in V vs SCE

The redox properties of three different PSPI (photosensitive polyimide) materials have been investigated in an attempt to determine possible combinations of PSPI materials which could be used to fabricate multilayered structures and permit the application of selective polyimide redox seeding.

The cyclic voltammetric (CV) response to Toray 3840 ® PSPI solution dissolved in N,N-dimethylformamide (DMF) containing 0.1M tetraethylammonium tetrafluorborate (TEAFB) as supporting electrolyte, is typical for a polyamic acide (polyimide precursor) material, based on the similarities in the CV's of amic acid model compounds non-PSPI polyamic acid polyimide materials. The wave seen near −0.7V vs SCE is broad with no sign of any type imide reductions which have been well characterized. This wave is probably associated with the electrochemical reduction of protons present as a impurity or introduced by the polyamic acid $(H+ +e- = \frac{1}{2} H_2)$.

Thin films (2500 Å) of the Toray 3840 ® were also cast onto optically transparent (indium doped $SnO_2$ coated glass) electrodes (OTE's). These films were cured by first blanket exposure (300 mj/cm²) UV and then soft curing at 160° C. for 2 hours to complete imidization. The electrochemical response of these films in 0.1M TEAFB DMF/acetonitrile (ACN) 1:4 mixture, is consistent with a BTDA polyimide. The CV shows three reversible redox waves at −1.02, −1.20 and −1.67 V vs SCE which indicates a benzophenone tetracarbodylic diimide structure. An additional fourth redox wave centered at −1.52 V is unknown and possibly due to the photopackage (sensitizer or initiator) in the PSPI material. Another material investigated is Asahi 6246 ® (PMDA-ODA and BTDA-ODA copolymer) material. The electrochemistry of the soluble starting material in 0.1M TBAFB/DMF provides clear evidence that this polymer is in a partially imidized form as received. The observed reversible redox couples are consistent with a PMDA and BTDA containing system. The fact that the starting material is partially imidized has important manifestations in selective seeding. In fact, in a reducing bath comprised of 0.1M TBAFB/ACN with 0.05M benzil, 10% reduced to radical anion, a blanket exposed by uncured Asahi 6246 ® film did undergo reduction and subsequent seeding.

As observed with the Toray films, thin films of Asahi 6246 ® on OTE's were prepared and imidized, the subsequent electrochemistry is complicated by specific kinetic effects related to charge transport and electron self-exchange within the film. The key observation is that although the film contains PMDA units, these kinetic effects inhibit the films ability to reduce and permit the deposition of Pd seed metal which requires two electrons per Pd+2 cation. While it is likely that the outermost layer of PMDA units directly in contact with the solution can be reduced by the benzil reducing agent, the presence of the BTDA units which cannot be reduced at this potential blocks the transport of charge into the film.

Combinations of PSPI and non-PSPI materials can be used together to allow selective seeding. For example, here are some structures which would allow, based on the electrochemistry, selective reduction of the bottom material which had a patterned material on top on act as a mask, the bottom material, will be listed first:

PI2545 ® (PMDA-ODA)/Toray 3840 ®
PI 2545 ®/Asahi 6246
PI 2545 ®/Ciba Geigy 412 ®
Asahi 6246/Toray 3840
Ciba-Geigy 412 ®/Toray 3840 ®
PI 2545 ®/PI 5811 ®

An alternative approach involves first activating (supplying electrons to) the base electroactive material layer and then disposing thereon a second electroactive material which is patterned to remove selected regions thereby selectively exposing the activated surface layer of the first electroactive layer. The exposed activated regions can then be exposed to a seeding solution to deposit seed thereon and thereafter electroless or electroplating deposition onto the seed can be done.

Table III lists the reduction potentials for various metal salts which can be used for depositing the seed metal onto reduced polymer surfaces.

TABLE III
REDUCTION AND OXIDATION POTENTIALS FOR METAL SALTS

| MATERIAL | REACTION | REDUCTION | OXIDATION |
|---|---|---|---|
| $AgBF_4$ | I → 0 | +0.22 | −0.42 |
| $CuIP(OCH_3)_4$ | I → 0 | −0.44 | −0.20 |
| $PdCl_2$ | II → 0 | −0.40, −0.75 | +0.64 |
| $PtBr_2$ | II → 0 | −0.5 | not meas. |
| $PdBr_2(NMP)$ | II → 0 | −0.67, −1.13 | +0.64 |
| $NiBr_2$ | II → 0 | −0.70, −0.80 | +0.16 |

CV's run in 0.1 M TBAFB/ACN, Pt electrode, 50 mV/sec
Potentials in V vs SCE

In the preferred embodiments, polyimide materials are used as the electroactive materials to fabricate structures shown in FIG. 4 and FIG. 5. Polyimides are dielectrics and therefore the patterned layer 34 can act as a permanent resist type material to fabricate the electrical conductors 50 and serves as a dielectric between independent electrical conductors 50.

The following is a detailed description of the electrochemistry involved in supplying electrons to the electroactive sites of polyimide materials which are the preferred electroactive materials used to practice the present invention. The invention is not limited to polyimide materials. For the sake of clarity this detailed description is being limited to the electron transfer to and from a single polyimide material. However, based on the preceding discussion it will be readily apparent to those of skill in the art how this description applies to the present invention.

The organic polymeric materials treated pursuant to the present invention are capable of being reduced, i.e. accept, electrons. In particular, such polymers are polyimide which include polyimides and modified polyimides. The Encyclopedia of Chemical Technology Third Edition article entitled, "Polyimides", vol. 18, p. 704–719, the teaching of which is incorporated by reference describes various polyimide materials including homopolymers. The polyimides are of interest in view of their continually expanding use in electronic devices and packaging and their widespread availability. Discussion of various electrochemical properties concerning polyimides can be found in U.S. Pat. No. 4,512,855 to Mazur; Haushalter, et al., "Thin Solid Films", 102, 161 (1983); Mazur, et al., "Electrochemical Society, Electrochemical Science and Technology", pp. 346–353, February 1987; and Mazur, et al., "Electrochemical Growth of Metal Interlayers and Polyimide Film", Journal of Physical Chemistry, 1986, 90, pp. 1365–1372.

Electroactive materials such as polyimide have the capacity of accepting electrons from another material or chemical entity at a finite rate without itself undergoing a change which limits this capacity. The chemical may be molecular, ionic, atomic or adjacent redox sites within or in contact with the polymer. The redox potential of the polymer is positive to the reduction potential of the chemical entity, thereby permitting the polymer to readily accept the electrons. The polymer must posses chemical functionality (redox sites) whose redox potential is positive relative to the redox potential of the chemical entity. Examples of such functional groups include the aromatic imide groups of modified and unmodified polyimides. The groups, as discussed above, are compatible with chemical entities whose reduction potentials are more positive that the oxidation potential of the reduced electroactive polymer. Other polymers with aromatic carbonyl moieties, which are electroactive, include terephthalate-containing polymers such as Mylar ®.

In addition, the polymer functionality must be reversibly redox active, that is, capable of accepting and donating electrons rapidly and without competing, irreversible chemical changes. This reversibility may require such precautions as exclusion of oxygen, potential proton donors or nucleophilic and electrophilic reagents. The polymer must also be able to take up sufficient solvent by swelling or absorption to permit diffusion of electrolyte ions into the polymer.

Preferably, the polymer should have a molecular weight sufficient that films of the material will maintain mechanical integrity in an electrolyte solution. The molecular weight required depends on the structure of the polymer and solvent and should generally be greater than 5,000–10,000 daltons.

The polyimides that can be treated in accordance with the present invention include unmodified polyimides, as well as modified polyimides such as polyester imides, polyethylene terephthalates, polyamide-imide-esters, polyamide-imides, polysiloxane-imides, fluorocarbon-containing polyimides, as well as other mixed polyimides or polyimide blend materials. Such as well known in the prior art and need not be described in any great detail.

Generally, the polyimides include the following recurring unit;

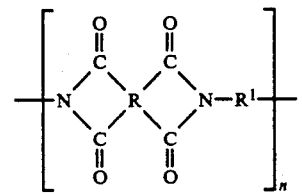

where n is an integer representing the number of repeating units to provide a molecular weight usually about 10,000 to about 100,000. R is at least one tetravalent organic radical selected from the group consisting of:

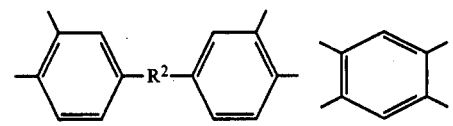

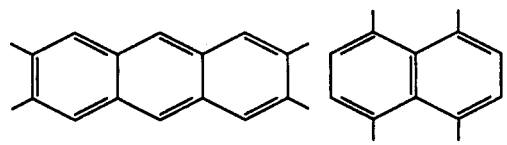

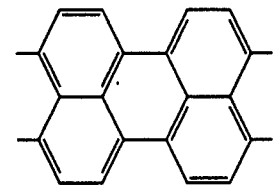

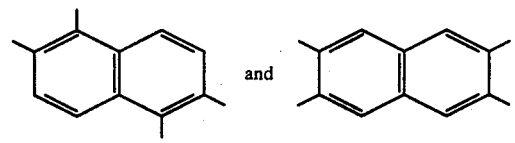

$R^2$ being selected from the group consisting of divalent aliphatic hydrocarbon radicals having from 1 to 4 carbon atoms and carbonyl, oxy, sulfo, sulfide, ether, siloxane, phosphine oxide, hexafluorisopropylidene and sulfonyl radicals and in which $R^1$ is at least one divalent radical selected from the group consisting of an aliphatic organic radical or from the group shown:

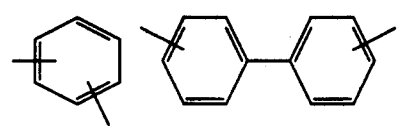

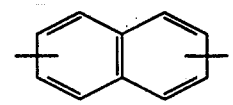

-continued

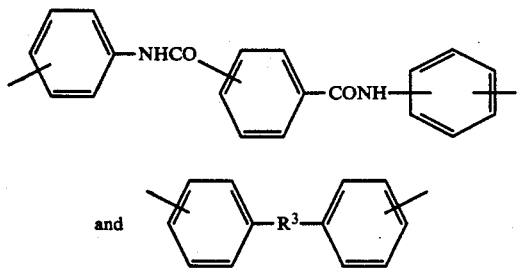

and in which $R^3$ is a divalent organic radical selected from the group consisting of $R_2$, silico, and amino radicals. Polymers containing two or more of the R and/or $R^1$ radicals, especially multiple series of $R^1$ containing amido radicals, can be used.

Generally, the polyimides having monoimide units have the following recurring units:

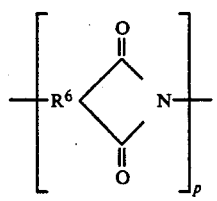

where $R^6$ is trivalent and p is an integer representing the number of repeating units to provide a molecular weight usually about 10,000 to 100,000. Examples of monoimide polyimides are given in "The Encyclopedia of Chemical Technology Third Edition" article incorporated herein by reference supra.

Other polymers with inherent electroreactive functional groups such as benzoyl or esters (e.g. polyethylene terephthalate, Mylar ®) or polymers with attache or pendant electroactive moieties such as phthalocyanine, vinyl pyridine, bipyridyl, benzophenones and quinones can be used as described for polyimides.

Polyimides are available commercially from a variety of suppliers in one of three forms: (a) as solutions of the polyamic acid precursors (e.g., DuPont Pyralin ®); (b) as pre-imidized film (e.g. DuPont Kapton ® film); or c) as pre-imidized powders (e.g., Ciba-Geigy Matrimid 5218 ®) or solutions (e.g., Ciba-Geigy Probimide ®).

The chemistry of commercial polyimides includes examples of many of the components listed above, but a preferred polymer for use pursuant to the present invention is based on the monomers pyromellitic dianhydride (PMDA) and oxydianiline (ODA), also named 4-aminophenylether. Other preferred polymers for use pursuant to the present invention are the polymers of 3,3',4,4'-benzophenonetetracarboxylic dianhydride (BTDA) and ODA and/or 1,3-phenylenediamine and polymer of 3,3',4,4'-biphenyltetracarbodylic acid (BPDA) and 1,4-phenylenediamine (PDA). Polyimide films based on PMDA-ODA are available from Allied Corporation under the tradename Apical ® and from DuPont under the tradename Kapton ®. Films based on BPDA-PDA and BPDA-ODA are available from Ube Corporation as Upilex ® and from Hitachi Chemical Company as PIQ-L10 ®. Other tradename polyimides useful pursuant to the present invention include Durimid ® from Rogers Corporation and the DuPont Pyralin ® series, including PI-2545, PI-2525 and PI-2566. The Upilex polyimides, although possessing higher thermal and dimensional stability than the Kapton polyimides, have not been widely used in integrated circuit packaging because of the absence of efficient wet etching processes for such polyimides.

The electrons can be provided by means of a cathode in an electrochemical circuit, the potential applied to the cathode being equal to or negative of the reduction potential of the polymer or preferably by means of a reducing agent in solution. The oxidation potential of the reducing agent must be negative with respect to the reduction potential of the polymer.

With respect to the polyimides, the imide functional groups of the polymer can be reduced (by one electron) to the radical anion, or reduced (by two electrons) to the dianion or diradical dianion or reduced (by three electrons) to the radical trianion as illustrated in the following reaction scheme for 3,3',4,4'-benzophenone tetracarboxylic diimide functional group where $e^-$ is an electron and $C^+$ is a counter cation. The polyimide can have more than three functional groups. When there are odd number of functional groups and each is reduced by one electron the resultant reduced polymer is most likely a radical anion. When there are an even number of functional groups and each is reduced by one electron the resultant reduced polymer is most likely anion.

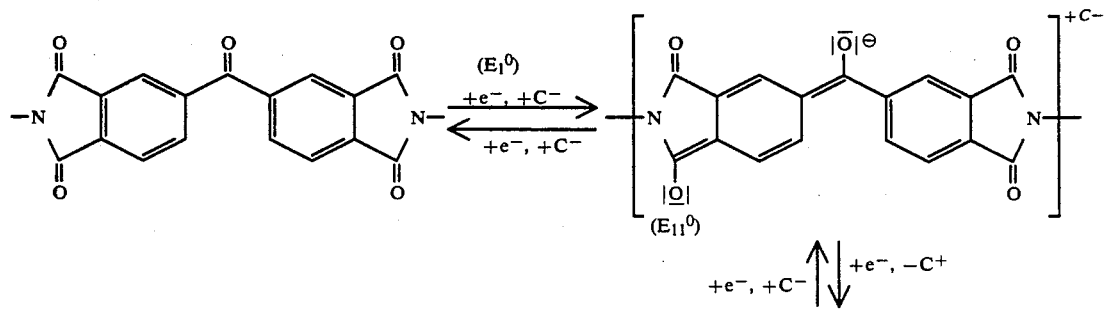

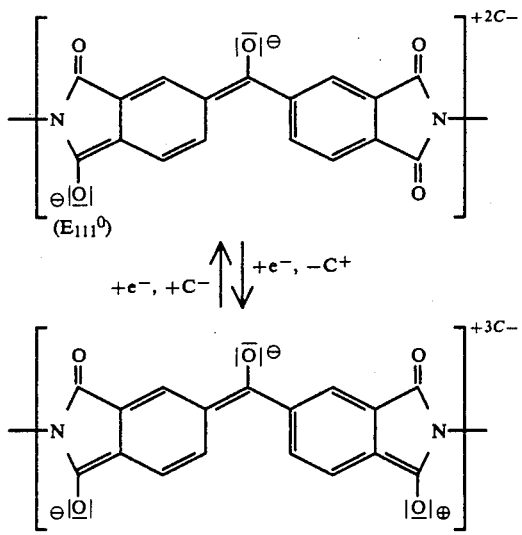

The following reaction illustrates the reduction of PMDA-ODA diimide functional group where e⁻ is an electron and C⁺ is a counter cation to the radical anion and dianion form.

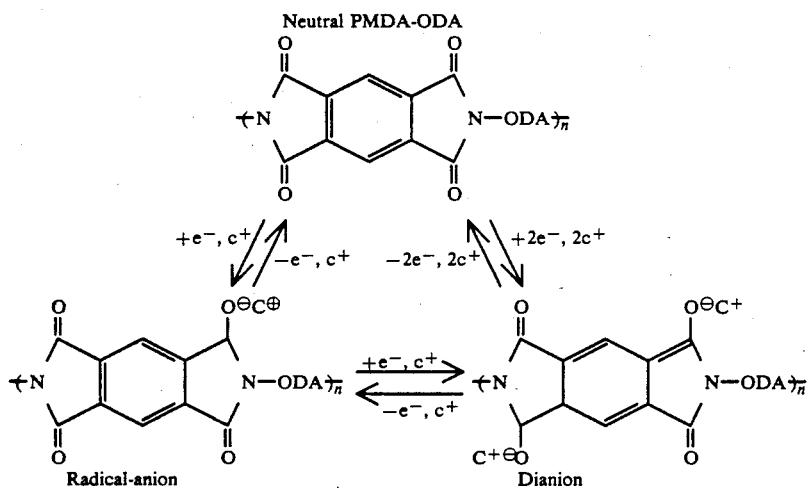

According to the preferred aspects of the present invention, the reduction is achieved by means of a reducing agent that has an oxidation potential negative with respect to the reduction potential of the polymer. With respect to polyimides, compounds such as benzil anion, anthraquinone anion, benzophenone anion, benzoin dianion, alkali metals of naphthalenide, anion of N'N'-di-n-butylpyromellitimide and even solvated electrons generated, for example, in liquid ammonia can be used as the reducing agent.

The reducing agents can be reducing agents per se, or produced such as in situ by electrochemical means. The reducing agents can be generated by chemical reaction such as by reacting benzoin and potassium tert-butoxide or be a compound having a strong electron donating power such as tetrakis (dimethylamino) ethylene.

Examples of suitable organic compounds that can be electrochemically reduced to provide the chemical reducing agent include, but are not limited to, the following groups of compounds: unsaturated aromatic hydrocarbons (e.g., anthracene), aldehydes and ketones (e.g., N-n-butylphthalimide, N,N'-di-n-butyl-3-3',4,4'-biphenyl tetracarboxylic diimide), carbodiimides (e.g., bis-(chlorophenyl carbodiimide), aromatic heterocyclic nitrogen compounds (e.g., 9,10-diazaphenanthrene), anhydrides (e.g., 1,8-naphthalic anhydride 3,3',4,4'-benzophenone tetracarboxylic dianhydride), quinone (e.g., 9,10-anthraquinone), quaternary aromatic nitrogen compounds (e.g., 1-ethylpyridinium bromide), azomethines (e.g., N-p-biphenylbenzalimine), immonium salts (e.g., N-ethyl-N-methyl benzophenone immonium salt) azo compounds (e.g. 4,4'-azobiphenyl), amine oxides (e.g., acridine N-oxide), nitro and nitroso compounds (e.g. 2-t-butylnitrobenzene), and organometallic compounds (e.g., dibiphenylchromium (I) iodide).

Benzil, 9-flourenone, benzophenone and anthracene are examples of specific compounds that can be reduced to provide the chemical reducing agents suitable for carrying out the present invention. The compounds can be reduced by applying such to an electrochemical cell containing an anode and a cathode and then applying a voltage.

The compounds can be reduced electrochemically or by bulk electrolysis. Typically, this is done using a two-compartment cell whereby the compartments are separated by a sintered glass disk or frit having a porosity of less than 8 μm. A salt bridge or semi-permeable membrane also could be used to separate the compartments. The working compartment is housed with a cathode electrode which is comprised of a metal such as platinum, carbon, or stainless steel. For potentiostatic operation an appropriate reference electrode is positioned in the working compartment (e.g., Ag/0.1M Ag $NO_3$).

The cell can be purged with an inert gas such as $N_2$ or argon using an inlet tube with one-way valve or operation can be done in a glove box under inert atmosphere.

Electrochemical generation of the reducing agent is accomplished by either galvanostatic, potentiostatic, or voltage-controlled electrolysis. Typically, the current density range for galvanostatic reduction 0.1 to 2 mA/cm$^2$. In potentiostatic mode, reduction is typically done by applying a potential to the cathode which is more negative (e.g. $-50$ mV or more) than the reduction potential for the organic compounds as measured against the same reference electrode.

Compounds such as potassium tert-butoxide can react with aromatic ketones and alcohols to form anionic species. For instance, potassium tert-butoxide reacts with benzion to form the benzoin dianion, or benzil radical-anion.

In addition, the composition used to reduce the polymer will include in the solution a supporting electrolyte and preferably a supporting electrolyte salt that contains as cation a member from one of the following groups: tetraalkylammonium, tetraalkylphosphonium, alkali metal, aryl-alkylammonium, aryl-alkylphosphonium, or chelated metal. The preferred tetraalkylammonium group is tetrabutylammonium, but other tetraalkyls with alkyl group being methyl, ethyl, propyl, isopropyl, pentyl, hexyl, or mixed alkyl thereof can be employed if desired. An example of a typical aryl group is phenyl and an aryl-alkylammonium is benzyl-tributylammonium. An example of a chelated metal cation is potassium 18-crown-6. The supporting electrolyte salt preferably contains as anion one of the following: tetrafluoroborate, hexafluorophosphate, aryl sulfonate, perchlorate, or halide such as bromide or iodide.

The electrolyte solution is preferably comprised of an aprotic solvent. The aprotic solvents suitable for use in this invention include, but are not limited to, the following: nitrile and nitro compounds (e.g., acetonitrile, benzonitrile, nitromethane), amide and cyclic amide compounds (e.g., N,N-diemthylformamide, N-methylformamide, N,N-diethylformamide, N-ethylformamide, N,N-dimethylacetamide, N-methyl-2-pyrrolidinone, hexamethylphosphoramide, ester, cyclic ester and ether components (e.g., propylene carbonate, ethylene carbonate, $\gamma$-butyrolactone, ethyl acetate, tetrahydrofuran, dimethylether, oxide and sulfo compounds (e.g., dimethylsufoxide, acetone, liquid sulfur dioxide, sulfolane, dimethylsulfone).

The reducing agents generated electrochemically, according to the present invention, are typically neutral organic molecules which are electrochemically charged, thereby transferring electrons to the polymer, thereby reducing it. The electron transfer returns the reducing agent back to its neutral state. This is in sharp contrast to those exotic reducing agents such as Zintl complexes ($Sng^{-4}$, $SnTe_4^{-4}$) that result in anions remaining with the polymer or are intercalated.

It has also been found, pursuant to the present invention, that the electrons can be supplied by contacting the polymeric material with tetrakisdimethylaminoethylene (TKDE). Tetrakisdimethylaminoethylaminoethylene is represented by the formula:

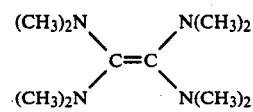

The TKDE can be used as such or employed in solution with an organic solvent including the aprotic solvents discussed above. Also, protic solvent such as water and alcohols including methanol, ethanol and ethylene glycol can be used provided such are made alkaline (e.g.—adding a base). The TKDE reduces sites of the polymeric material to, for example, the radical anion-form while it is concurrently oxidized to a cation form. The TKDE cations function as counterspecies to balance the charge imparted to the polymer in order to maintain electroneutrality throughout the reduced region of the polymer. The oxidized TKDE (cation) can subsequently be regenerated to neutral TKDE, for example, by reductive electrolysis. This material can function as the solvent and counterions in addition to its reducing agent function.

The polyimide, which, after being reduced by the reducing agent contains a region of reduced polyimide near the exposed surface, can then be exposed to a solution of the electrophile in order to open at least one of the imide rings in the polyimide repeat unit.

Table IV is an exemplary list of reducing agents and the reduction potential referenced to a standard calonel electrode (SCE).

TABLE IV

| REDUCING AGENTS, POTENTIAL V vs. SCE | | | |
|---|---|---|---|
| SUBSTANCE | REACTIONS | SOLVENT | V |
| ANTHRACENE (AN) | AN + e− = AN− | ACN$^1$ | −1.94 |
| BENZOPHENONE (BP) | BP + e− = BP− | DMF$^2$ | −1.88 |
| | | ACN | −1.75 |
| | | NMP$^3$ | −1.68 |
| DIMETHYLTEREPHTHALATE (DT) | DT + e− = DT− | DMF | −1.62 |
| 9-FLUORENONE (Fl) | Fl + e− = Fl− | ACN | −1.28 |
| | | DMF | −1.19 |
| BENZIL (BZ) | BZ = e− = BZ− | ACN | −1.13 |
| | | DMF | −1.04 |
| | | NMP | −1.04 |
| RU-BIS-(2,4,6-TRIPYRIDYL-S-TRIAZINE) (RT) | RT$^{+2}$ = e− = RT + | ACN | −0.97 |
| | RT$^{+3}$ + e− = RT +$^2$ | ACN | −0.81 |
| TETRAKIS(DIMETHYLAMINO)-ETHYLENE (TE) | TE− + e− = TE$^{-2}$ | MeOH | −0.76 |
| | TE + e− = TE− | MeOH | −0.64 |

TABLE IV-continued

| REDUCING AGENTS, POTENTIAL V vs. SCE | | | |
|---|---|---|---|
| SUBSTANCE | REACTIONS | SOLVENT | V |
| PHENANTHRAQUINONE (PQ) | PQ + e− = PQ− | ACN | −0.64 |

[1]ACETONITRILE
[2]N,N-DIMETHYLFORMAMIDE
[3]N-METHYL-2-PYRROLIDINONE
[4]METHANOL

The electrons can be supplied to the redox sites of the polymeric material also be employing electrochemical means. In particular, the process involved requires providing the polymer onto a metal electrode which, when negatively biased, acts as a cathode in the circuit. An alternative approach is to contact the polymer surface to be reduced with a cathodic electrode in an electrochemical cell.

A typical arrangement to carry out this particular procedure pursuant to the present invention is illustrated in U.S. Pat. No. 4,512,855, the teaching of which is incorporated herein by reference.

The combination of the electrode and polymeric film is then immersed into an electrolyte solution in an aprotic solvent.

In addition, the composition used to reduce the polymer will include in the solution a supporting electrolyte and preferably a supporting electrolyte salt that contains as cation a member from one of the following groups: tetraalkylammonium, tetraalkyphosphonium, alkali metal, aryl-alkylammonium, aryl-alkylphosphonium or chelated metal. The preferred tetraalkylammonium group is tetrabutylammonium, but other tetraalkyls with alkyl group being methyl, ethyl, propyl, isopropyl, pentyl, hexyl or mixed alkyl thereof can be employed if desired. An example of a typical aryl group is phenyl and an aryl-alkylammonium is benzyltributylammonium. An example of a chelated metal cation is potassium 18-crown-6. The supporting electrolyte salt preferably contains as anion one of the following tetrafluoroborate, hexafluorophosphate, arylsulfonate, perchlorate or halide such as bromide or iodide.

The electrolyte solution is preferably an aprotic solvent. The aprotic solvents suitable for use in this invention include, but are not limited to the following: nitrile and nitro compounds (e.g., acetronitrile, benzonitrile, nitromethane), amide and cyclic amide compounds (e.g., N,N-dimethylformamide, N-methylformamide, N,N-diethylformamide, N-ethylformamide, N,N-dimethylacetamide, N-nethyl-2-pyrrolidone, hexamethylphosphoramide, ester, cyclic ester), and either compounds (e.g., propylene carbonate ethylene carbonate, γ-butyrolactone, ethyl acetate, tetrahydrofuran, dimethylether), oxide and sulfo compounds (e.g., dimethylsulfoxide, acetone, liquid sulfur dioxide, sulfolane, dimethylsulfone).

In the event that the electrons are supplied to the polymer film by a cathode in an electrochemical circuit, the potential applied to the cathode must be equal to or negative of the reduction potential of the polymer for which typically values are given in Table 1.

Polyamides, polymers, copolymers, tricopolymers, polycopolymers having in the back bone one or more of the following imide group or mixtures of these polyimides can be used to practice the present invention: BTDA (benzophenone tetracarboxylic dianhydride, BPDA (benzophenone biphenyltetracarboxylic dianhydride) NTDA (naphthalene tetracarboxylic dianhydride) HFDA (hexafluoroisopropylidene tetracarboxylic dianhydride).

If the polyimide material is in a liquid form it can be added to a solution with the solvents above and reduced by the chemical or electrochemical methods described herein above. If the polyimide material is not soluble in the solvent, the insoluble polyimide can be placed into an aprotic solvent as described herein above and reduced by the chemical and electrochemical methods described herein above. Reduced polyimide will then become soluble in the aprotic solvent. Examples of polyimides which are not directly soluble in commonly available solvents are polyimide materials based on PMDA-ODA (pyromellitic dianhydride-oxydianaline) and BPDA-PDA (biphenyltetracarboxylic dianhydride 1,4-phenylenediamene). Examples of polyimides which are soluble in the commonly available solvents are Thermid ®, XU-218 ®, Ciba-Geigy 412 ®.

The present invention is not limited to chemical and electrochemical methods for reducing the polyimide described herein above. Any method of providing electrons to the imide functional groups of the polyimide can be used to practice the present invention.

It is to be understood that the above described embodiments are simply illustrative of the principles of the invention. Various other modifications and changes may be devised by those of skill in the art which will embody the principles of the invention and fall within the spirit and scope thereof.

The first and second electroactive material have different reduction potentials. The method comprises supplying electrons having an energy negative of the energy of the reduction potentials of one of the electroactive material bodies and positive of the reduction potential of the other electroactive material body. Electrons are transferred to the material body having the reduction potential more positive than the energy of the electrons and the electrons are not transferred to the electroactive material having a reduction potential which is negative of the energy of the electrons. The electrons are supplied to redox sites of the electroactive material. The electroactive material to which the electrons have been supplied is dissolved in a solvent.

The electrons are supplied to the redox sites of the electroactive material by means of a cathode and an electrochemical circuit, the potential applied to the cathode being equal to or negative of the reduction potential of the electroactive material from which the electrons are transferred and positive of the reduction potential of the electroactive material from which the electrons are not transferred. The electrons are preferably transferred by means of a reducing agent in solution, the oxidation of the reducing agent being negative with respect to the reduction potential of the electroactive materials to which the electrons are transferred. Alternatively, the electrons can be supplied to the redox sites of the electroactive material tetrakis(dimethylamino)ethylene.

It is to be understood that the above described embodiments are simply illustrative of the principles of the invention. Various other modifications and changes may be devised by those of skill in the art which will embody the principles of the invention and fall within the spirit and scope thereof.

Having thus described our invention, what we claim as new and desire to secure by Letters of Patent is:

1. A structure comprising:
   a first electroactive body;
   a second electroactive body disposed against said first electroactive body;
   said second electroactive body having a pattern therein exposing at the base of said pattern said first electroactive body;
   said first and second electroactive bodies having different redox potential energies.

2. The structure of claim 1, wherein the redox potential energy of said first electroactive body is less than the redox potential of said second electroactive body.

3. The structure of claim 2, wherein at least a part of said first electroactive body is in a chemically reduced condition.

4. The structure of claim 2, further including a seed material on said exposed parts of said first body at said base of said pattern.

5. The structure of claim 4, wherein said seed material is selected from the group consisting of Pd, Pt, Ru, Au, Ag, Cu, Ni, Co and Sn.

6. The structure of claim 5, further including an electrically conducting material on said seed.

7. The structure of claim 5, wherein said electrically conducting material is selected from the group consisting of Pd, Ni, Cu, Ag, Au, Co Pt and Sn.

8. The structure of claim 1, wherein said pattern in said second body is substantially filled with an electrically conducting material.

9. The structure of claim 1, wherein said first and said second bodies are polymeric materials.

10. The structure of claim 9, wherein said polymeric materials are polyimide materials.

11. The structure of claim 1, wherein said electroactive materials are capable of transporting electrons in a reversible manner.

12. The structure of claim 1, wherein said first and said second electroactive body contains a material including one or more of the groups selected from the group consisting of BPDA, BTDA, NTDA, PMDA and HFDA.

13. The structure of claim 1, wherein said first electroactive body is selected from the group of BPDA-PDA, BTDA-ODA, BTDA-DAPI, BTDA-APB, NTDA-ODA, PMDA-ODA, PMDA-HDA, PMDA-MCA, BTDA-ODA and BPDA-ODA polyimdes and said second electroactive material is selected from another member of said group.

14. A method comprising:
   providing a solution capable of transporting electric charge;
   immersing in said solution a first and second electroactive body;
   said first electroactive body having a redox potential energy greater than the redox potential energy of said second electroactive body;
   providing electrons to said first and said second electroactive bodies having an energy sufficient to be transferred to said second electroactive body but not sufficient to be transferred to said first electroactive body.

15. The method of claim 14, wherein said electrons are provided by a reducing agent in said solution, said reducing agent being energetically disposed to transferring electron(s) to redox sites on said second electroactive body.

16. The method of claim 15, wherein said reducing agent is generated in solution by applying a voltage between an anode and cathode immersed in said solution.

17. The method of claim 14, wherein said electrons are provided electrochemically.

18. The method of claim 14, wherein said first body is disposed against said second body.

19. The method of claim 18, wherein one of said first and said second bodies has a pattern therein exposing the other of said bodies in said pattern.

20. The method of claim 19, further including exposing said first and second bodies to a seeding solution resulting in seed being deposited at the exposed surface of said second body.

21. The method of claim 20, wherein said seed is selected from the group consisting of Pd, Pt, Ru, Au, Ag, Cu, Ni, Co and Sn.

22. The method of claim 21, wherein a conductive material is electrolessly disposed on said seed.

23. The method of claim 22, wherein said electrolessly deposited material is selected from the group consisting of Pd, Cu, Ni, Au, Ag, Co, Pt and Sn.

24. The method of claim 14, wherein at least one of said first and said second bodies are polymeric bodies.

25. The method of claim 14, wherein at least one of said bodies comprises a polyimide material.

26. The structure of claim 24, wherein said first and said second electroactive bodies contain a material including one or more of the groups selected from the group consisting of BPDA, BTDA, NTDA, PMDA and HFDA.

27. The method of claim 24, wherein one of said electroactive bodies is selected from the group consisting of BTDA-DAPI, BTDA-APB, NTDA-ODA, PMDA-ODA. PMDA-HDA, PMDA-MCA, BTDA-ODA and BPDA-ODA polyimides and the other of said bodies is selected from another member of said group.

28. The method of claim 15, wherein said chemical reducing agent is a neutral organic compound whereby all or a portion of the said neutral organic compound has been electrochemically reduced in an aprotic solvent containing a supporting electrolyte salt.

29. The method of claim 28, wherein said neutral organic compound is at least one specie selected from the group of unsaturated aromatic hydrocarbons, aromatic carbonyl compounds, imides, diimides, carbodiimides, anhydrides, quinones, quaternary aromatic nitrogen compounds, aromatic heterocyclic nitrogen compounds, azomethines, immonium salts, azo compounds, amine oxides, nitro and nitroso compounds and organometallic compounds.

30. The method of claim 15 wherein said reducing agent is selected from the group of benzoin dianion, benzil anion, anthracene anion, dibenzoylmethane radical anion, benzophenone anion, anthraquinone anion, 9-fluorenone, N-n-butylphthalimide anion, N,N'-di-n-butyl-3,3',4,4'-biphenyltetracarboxylic diimide anion, N,N'-di-n-butylpyromellitic diimide anion, acridine anion and 1-azafluoranthene anion.

31. The method of claim 28 wherein said supporting electrolyte salt contains a cation which is at least one member of the group of tetraalkylammonium, tetraalkylphosphonium, alkali metal, mixed alkyl-aryl ammonium, mixed alkyl-aryl phosphonium, or chelated metal and said supporting electrolyte salt anion is at least one member selected from the group of tetrafluoroborate, hexafluorophosphate, perchlorate, halide, aryl sulfonate, and aromatic organic compounds.

32. The method of claim 28 wherein said supporting electrolyte salt contains at least one member selected from the group of tetrabutylammonium tetrafluoroborate, tetraethylammonium, tetrafluoroborate, tetrabutylammonium, hexafluorophosphate, tetraethylammonium bromide, lithium tetrafluoroborate, lithium perchlorate, benzylbutylammonium tetrafluoroborate and sodium naphthalenide.

33. The method of claim 28 wherein said aprotic solvent is at least one member selected from the group of nitriles, nitro compounds, amide, cyclic amide, amines, esters, cyclic esters, ethers, carbonates, oxides and sulfo compounds.

34. The method of claim 17, wherein said electrons are supplied electrochemically by a cathode in contact with said first and said second electroactive bodies in an electrochemical circuit using an aprotic solvent containing a supporting electrolyte salt.

35. The method of claim 28, wherein the electrochemical reduction of said reducing agent is done by either control of the current supply or control of the applied potential.

36. The method of claim 34 wherein said supporting electrolyte salt contains a cation of at least one member of the group tetraalkylammonium, tetraalkylphosphonium, alkali metal, mixed alkyl-aryl ammonium, mixed alkyl-aryl phosphonium, or chelate metal and said supporting electrolyte salt anion is selected from at least one member of the group tetrafluoroborate, hexafluorophosphate, perchlorate, halide, aryl sulfonate or aromatic organic compounds.

37. The method of claim 34 wherein said supporting electrolyte salt is at least one member selected from the group tetrabutylammonium tetrafluoroborate, tetraethylammonium tetrafluoroborate, tetrabutylammonium hexafluorophosphate, tetraethylammonium bromide, lithium tetrafluorophosphate, tetraethylammonium bromide, lithium tetrafluoroborate, lithium perchlorate, benzyltributylammonium tetrafluoroborate.

* * * * *